(12) United States Patent
Sedberry et al.

(10) Patent No.: US 7,743,702 B2
(45) Date of Patent: Jun. 29, 2010

(54) METHOD FOR APPLYING ELECTRONIC CIRCUITS TO CURVED SURFACES

(75) Inventors: Donald C. Sedberry, North Wales, PA (US); Derek S. Rollins, Philadelphia, PA (US); David S. Metzger, Philadelphia, PA (US)

(73) Assignee: Max Levy Autograph, Inc., Philadelphia, PA (US)

( * ) Notice: Subject to any disclaimer, the term of this patent is extended or adjusted under 35 U.S.C. 154(b) by 709 days.

(21) Appl. No.: 11/458,307

(22) Filed: Jul. 18, 2006

(65) Prior Publication Data

US 2008/0028956 A1 Feb. 7, 2008

(51) Int. Cl.
*B41M 1/12* (2006.01)
*B41M 1/40* (2006.01)
*B41F 15/30* (2006.01)
*B41F 15/32* (2006.01)
*B41F 17/28* (2006.01)

(52) U.S. Cl. .................. 101/129; 101/35; 101/114; 101/41; 101/491

(58) Field of Classification Search .................. 101/129, 101/35, 41, 114, 491; 427/96.1, 97.1, 97.3, 427/98.4; 342/2; *B41F 17/28, 15/32, 15/30*
See application file for complete search history.

(56) References Cited

U.S. PATENT DOCUMENTS

| | | | | |
|---|---|---|---|---|
| 3,606,162 A | * | 9/1971 | Lehmann | 239/227 |
| 4,047,174 A | * | 9/1977 | Wohlers | 342/5 |
| 4,266,476 A | * | 5/1981 | Maloof | 101/35 |
| 4,897,676 A | | 1/1990 | Sedberry | |
| 5,576,710 A | * | 11/1996 | Broderick et al. | 342/1 |
| 6,158,341 A | * | 12/2000 | Holmberg | 101/170 |
| 6,200,630 B1 | * | 3/2001 | Eriksson | 427/123 |
| 6,553,662 B2 | | 4/2003 | Sedberry | |
| 2006/0125074 A1 | * | 6/2006 | Fisher et al. | 257/690 |

* cited by examiner

*Primary Examiner*—Leslie J Evanisko
(74) *Attorney, Agent, or Firm*—William H. Eilberg

(57) ABSTRACT

An electric circuit is applied to an object having a curved surface. The curved surface of the object is divided into sections, and the circuit is applied one section at a time. The circuit is formed between layers of dielectric material. The dielectric is applied by a computer-controlled device, which controls the position of a spray head and the rotation of the object, such that the spray head is held substantially perpendicular to the surface of the object at all times, and such that a controlled thickness of dielectric material can be deposited. The fine-featured circuits formed by the invention are rugged, and can be used on objects intended to be exposed to harsh environments.

7 Claims, 7 Drawing Sheets

METHOD FOR APPLYING ELECTRONIC CIRCUITS TO CURVED SURFACES

BACKGROUND OF THE INVENTION

This invention relates to the field of electric or electronic circuits which are embedded within a dielectric and applied to a curved surface. The invention is especially useful in manufacturing circuits which are intended to operate in harsh environments.

As used herein, the term "circuit" is used in its broadest sense, to include any pattern of electrical conductors which accomplishes some useful object. Such circuits may be active or passive.

One example of the use of the present invention is in the aerospace and defense industries. It may be necessary to provide circuitry as a covering for the nose cone or radome of a missile, or the nose of an aircraft, to act as shield against radio frequency (RF) energy, or as an electromagnetic shield. Certain circuit patterns may be capable of blocking incoming radiation while remaining transparent to radiation transmitted by an internal antenna within the missile or aircraft. The invention is not necessarily limited to use in the above field, but could be used in other areas.

In the applications described above, the circuit which is applied to a nose or nose cone must be extremely rugged, and must withstand extreme conditions of pressure and temperature, without degradation. The circuit must be capable of withstanding the extreme heat encountered when a missile is traveling at high velocity within the atmosphere, or when a space vehicle re-enters the atmosphere, or when an aircraft is traveling at high speeds. The circuit must not be affected by other environmental factors, such as extreme cold, water, rain, or erosion.

To achieve the desired degree of ruggedness, the circuit is preferably provided in the form of a conductive cermet, embedded between layers of a compatible dielectric material, having the same or better environmental performance as the cermet. In the examples given above, this embedded circuit could be formed on the nose cone or nose, or other structure.

A "cermet" is a material containing particles of metal dispersed in a ceramic carrier. Initially, the cermet may take the form of a paste. When fired at high temperatures, the metal particles melt and fuse together, so that the metal particles become an integral electrical conductor which remains conductive when cooled. In this specification, the terms "conductive cermet" and "conductive material" will be used to include the cermet paste, although it should be understood that the material does not actually become electrically conductive until it has been fired. Examples of such cermet materials, and of their uses, are given in U.S. Pat. Nos. 4,897,676 and 6,553,662, the disclosures of which are incorporated by reference herein.

In the specific applications described above, it is important that the circuit be applied with precision, so that it has uniform geometry and significant thickness. When using the techniques of the prior art, such precision is virtually impossible to achieve when it is desired to apply the circuit to complex curved substrate surfaces, such as an ogive nose cone.

The present invention provides a practical and economical method and apparatus for applying rugged electronic circuits, of the type described above, and to many other types of curved surfaces.

SUMMARY OF THE INVENTION

The present invention includes a method for applying an electrical circuit to an object having one or more curved surfaces. In general, the method includes applying a first sealing and smoothing layer of dielectric material to the surface or substrate, screening or stenciling a layer of electrically conductive patterned or solid material onto the dielectric, the screening or stenciling being performed for a plurality of sections of the curved surface, each section occupying less than the entirety of the curved surface, and applying a covering layer of dielectric material onto the conductive material.

It is by dividing the curved surface into relatively small sections that the circuit can be precisely screened or stenciled onto the curved surface. If the sections are reasonably small, each section of the curved surface can be considered relatively flat, and it becomes easy to screen or stencil a circuit onto such section.

The application of dielectric is preferably performed by a computer controlled spray head, wherein the spray head has three degrees of freedom, and wherein the object can also be rotated under computer control. The spray head is positioned so that it is always substantially perpendicular to the object being coated. In this way, a thin dielectric layer, having a very uniform thickness, can be applied to the entire surface.

The circuit is applied to a section of the curved surface with the aid of a screen or stencil segment, the screen or stencil segment corresponding to a section of the curved surface. The screen or stencil segment may be used multiple times to span the surface of the object. Alternatively, a plurality of different screen or stencil segments can be used, thereby applying different circuit patterns to different sections of the curved surface.

In a preferred embodiment, wherein the object comprises an ogive cone having rotational symmetry, the surface of the object is divided into a plurality of complex tapered sections, and the circuit is first applied to every other section, and then applied to the remaining sections. Thus, the circuit elements are laid down in a process whereby a first group of sections are interleaved with a second group of sections.

The invention also includes apparatus suitable for performing the above-described methods. In one preferred embodiment, the apparatus includes a pivotable fixture, capable of holding a frame which contains a screen or stencil segment, the fixture being movable towards and away from the object. A conductive material can be applied to a section of the object when the screen or stencil segment is positioned immediately adjacent the object. After the conductive material has been applied, the fixture is moved away from the object, and the object is indexed so that an untreated section of the surface is accessible by the fixture.

The invention therefore has the primary object of providing a method and apparatus for applying an electrical or electronic circuit pattern to an object having a curved surface.

The invention has the further object of applying a circuit to a curved surface, wherein the circuit is formed between thin, uniform layers of a dielectric material.

The invention has the further object of providing methods and apparatus for applying a rugged electrical circuit to an object which is intended to be used in a harsh environment.

The invention has the further object of reducing the expense of applying precision electric circuits to curved surfaces.

The reader skilled in the art will recognize other objects and advantages of the present invention, from a reading of the following brief description of the drawings, the detailed description of the invention, and the appended claims.

DETAILED DESCRIPTION OF THE INVENTION

The present invention includes a method and apparatus for applying electrical circuits to objects having curved surfaces. The circuit is intended for use in rugged environments, and is therefore embedded within a dielectric which is applied to the curved surface.

In very general terms, the process of the present invention includes preparing the curved surface to insure that it is smooth, applying one or more initial layers of dielectric to the surface, applying conductive cermet defining the desired circuit, and applying one or more final or covering layers of dielectric. The step of applying the conductive cermet is performed for various sections of the surface, each section comprising less than the entirety of the surface.

Figure 1:
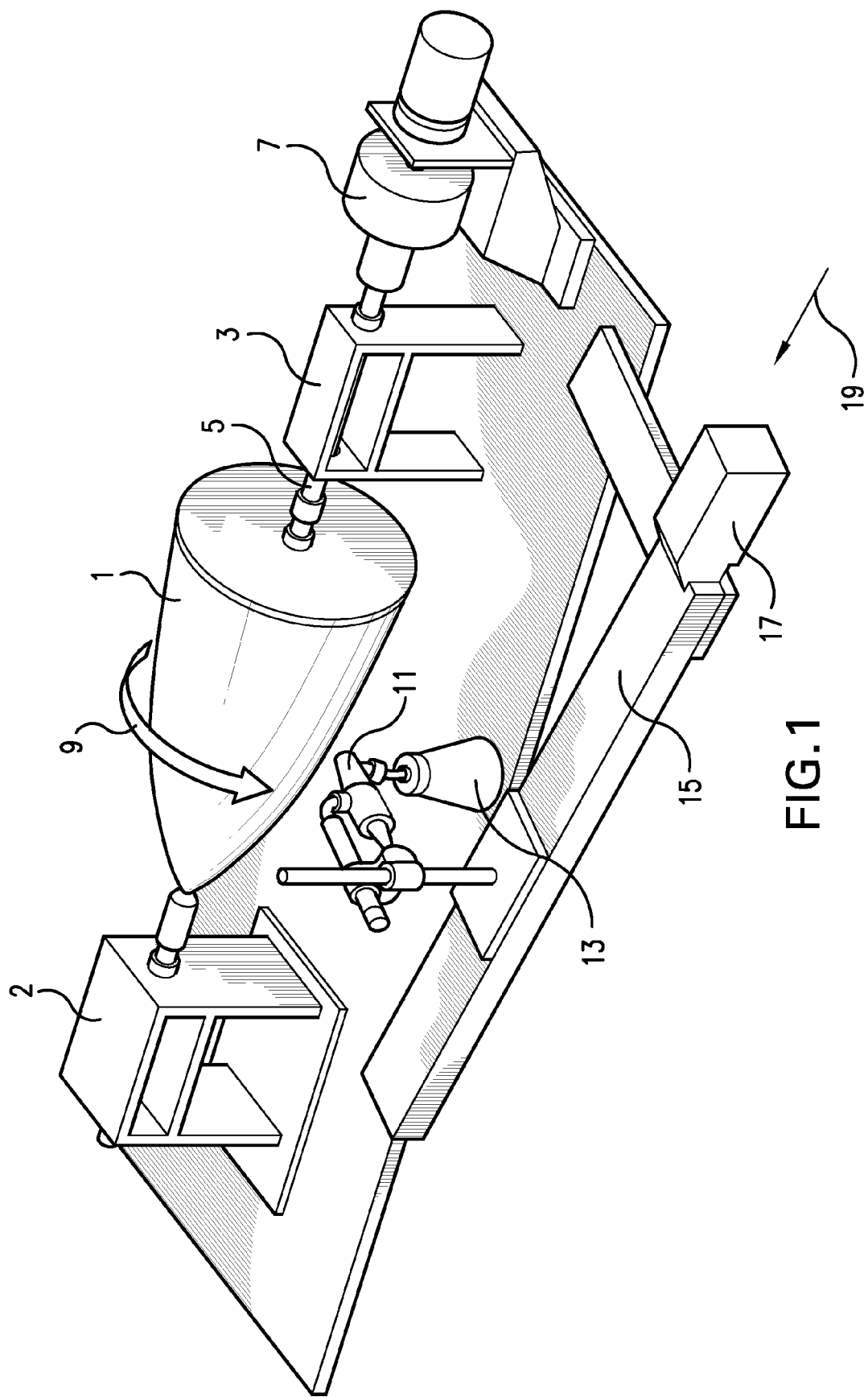
FIG. 1 provides a perspective view of a robotic device, made according to the invention, for applying a precisely controlled thickness of dielectric material onto a curved surface.
Figure 2:
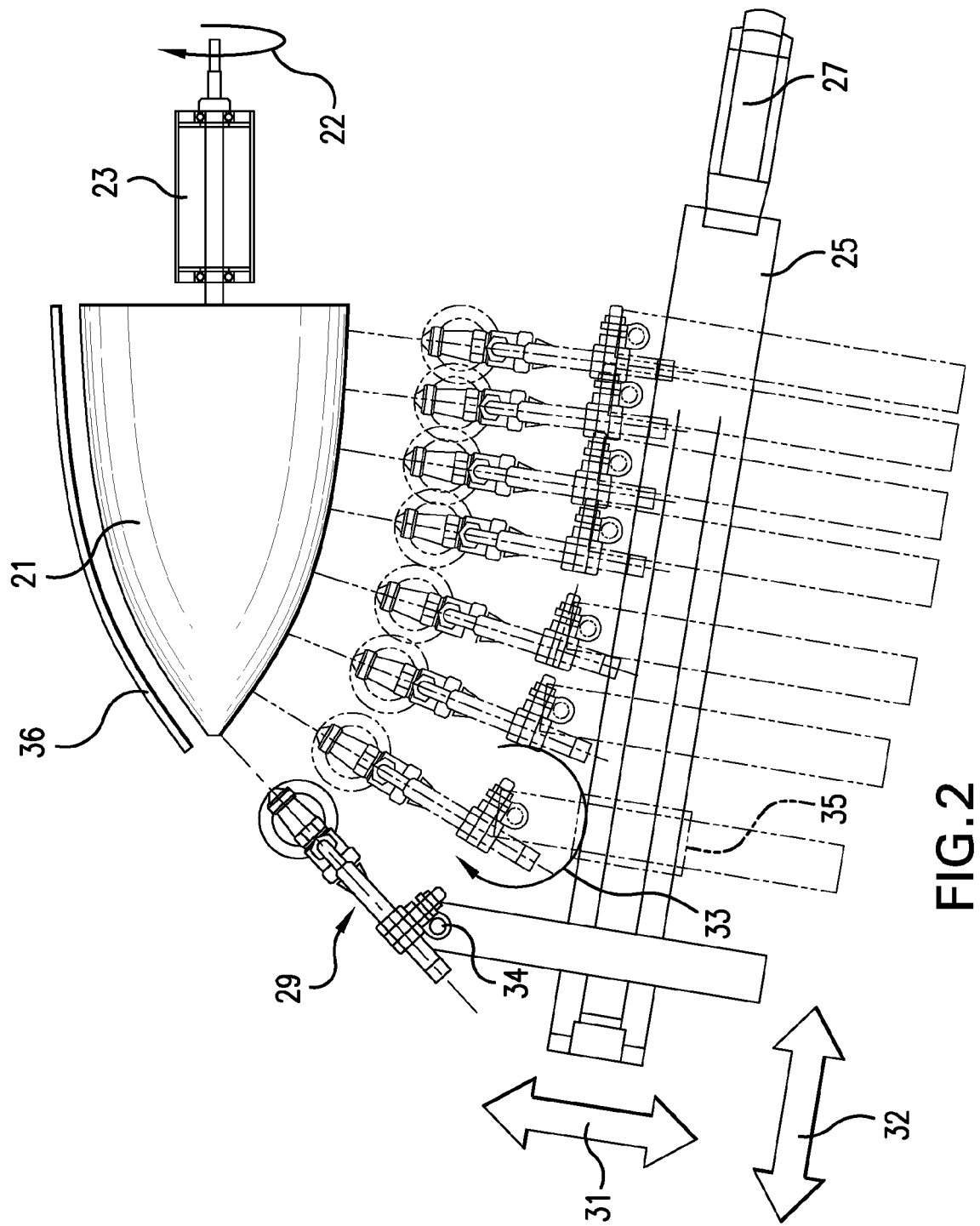
FIG. 2 provides a top view of a modified version of the robotic device of FIG. 1, showing, in phantom, various positions of a spray head used for applying dielectric material onto an ogive curved surface.
Figure 3:
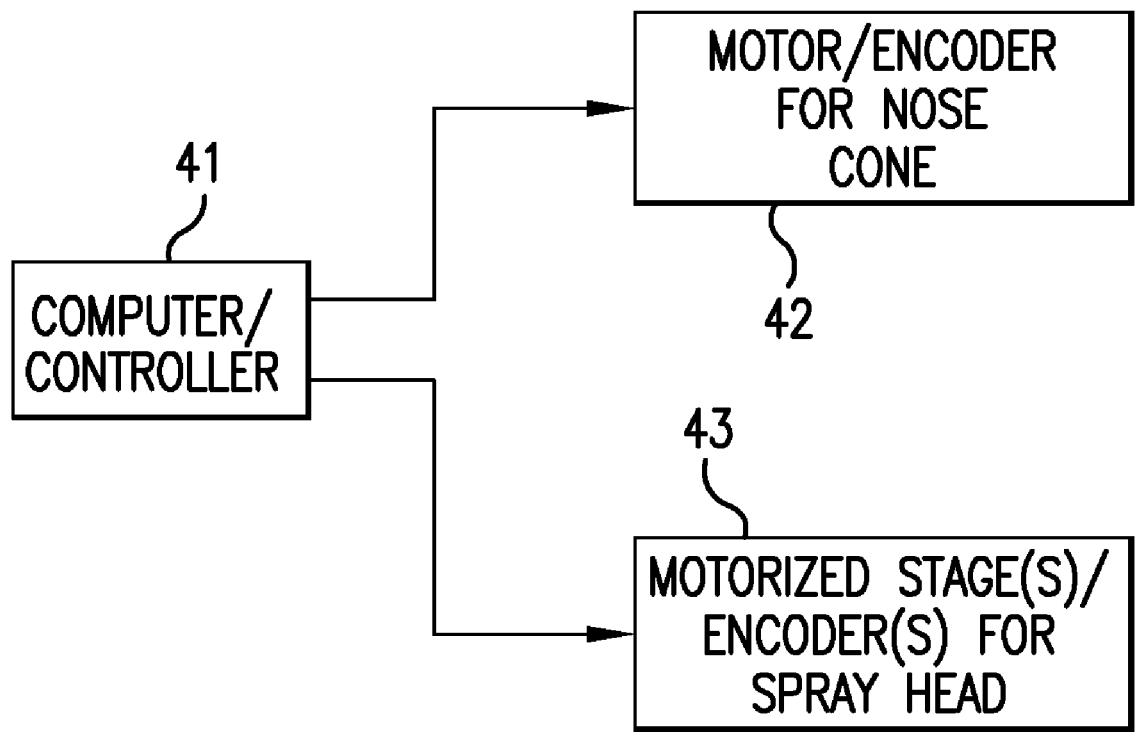
FIG. 3 provides a block diagram showing the computer control of the robotic device of either of FIGS. 1 or 2.

FIGS. 1-3 illustrate the apparatus for applying the dielectric. FIG. 1 illustrates a simple form of a curved object to which a circuit is to be applied, namely an ogive nose cone 1, mounted for rotation with shaft 5, and supported by supports 2 and 3. Motor/encoder 7 rotates the shaft, and therefore causes rotation of the ogive nose cone, as indicated by arrow 9. In the example represented, the nose cone is the object having an ogive curved surface, onto which the dielectric material and conductive cermet circuit are to be applied.

A dielectric material is deposited onto the surface of the nose cone by spray head 11, which dispenses dielectric material stored in reservoir 13. The spray head and reservoir are mounted on support 15 which is connected to linear motor/encoder 17, to enable the spray head to move with one degree of freedom, as indicated by arrow 19. This arrangement, through computer control of the linear position of the spray head, and rotational control of the ogive nose cone, provides a basic level of thickness control of the dielectric layer(s). The programming and coordinated computer control of the position of a single-axis or three-axis spray head, and rotation of the ogive nose cone, will be explained later.

The term "dielectric" includes electrically insulating materials which are capable of being fired at high temperatures. Examples of dielectric materials which can be used, in the present invention, are given in U.S. Pat. Nos. 4,897,676 and 6,553,662, cited above. Dielectrics may be supplied in the form of a slurry which can be sprayed onto a surface, as indicated by FIG. 1.

An ogive nose cone is only one example of an object, having a curved surface, onto which the circuit is to be applied. The present invention is not limited to the case in which the object is an ogive nose cone, but is applicable to many other objects having at least one curved surface. It should therefore be understood that whenever an "ogive nose cone" is referenced in this description, other objects having curved surfaces could be substituted, with appropriate modifications to the hardware. Such other objects are intended to be included within the scope of the invention.

In the present invention, it is important to apply the dielectric in one or more layers of uniform thickness. Therefore, the present invention includes the step of spraying the dielectric in such a manner that the spray head is always exactly perpendicular to the portion of the surface being sprayed. To maintain this perpendicular orientation, it is necessary to control carefully the position of the spray head.

FIG. 2 provides a top view of a modified version of the apparatus of FIG. 1. FIG. 2 shows a nose cone 21, rotated by motor 23, as shown by arrow 22. A linear stage 25, moved by motor/encoder 27, holds spray head 29, which is mounted to a second motor/encoder-driven linear stage 35, attached at an approximately right angle to linear stage 25. The second stage 35 enables the spray head to move in a direction that, with proper computer control, allows the spray nozzle to maintain a controlled distance from the ogive nose cone, as the spray nozzle moves along the linear stage 25. This positional precision is further enhanced by mounting the spray head to a rotational motor/encoder 34 which allows the spray head to be rotated such that its nozzle is always perpendicular to the surface of the ogive nose cone. These movements are shown in various positions (illustrated in phantom).

FIG. 2 more explicitly shows the degrees of freedom of the spraying apparatus. Specifically, the support can move towards or away from the nose cone, as indicated by arrow 31. The support can move parallel, or at an optimized tilted angle, to the axis of the nose cone, as indicated by arrow 32. Also, the spray head can rotate around post 34, as indicated by arrow 33. Combinations of these three motions, under computer control, will enable the spray head to be dynamically positioned, during the entire spraying operation, perpendicular to, and at the preferred distance from, the surface of the ogive nose cone, as illustrated in FIG. 2. Note also that the additional degree of freedom provided by the computer coordination of these three axes with the rotational speed of the nose cone allows the spray head shown in FIG. 2 effectively to reach virtually any point on the nose cone, and to deposit a very uniform layer of dielectric material.

To explain the above concept further, suppose that the spray head is opposite a portion of the nose cone which has a diameter of 6 inches. If the nose cone is rotating at 60 revolutions per minute, the spray head will traverse about 6×3.1416×60 or about 1131 inches in one minute. But if the diameter of the nose cone is only 4 inches, the distance covered in a minute would be only about 754 inches. So, to obtain the same coverage of material per unit time, one must slow down the rotational speed, when the spray head is opposite the larger diameter portion, and/or speed up the rotational speed when the spray head is opposite the smaller diameter portion. If the speed is not so regulated, either too much or too little dielectric material will be applied.

Also, the system is preferably programmed to move the spray head towards or away from the nose cone, for further control of the thickness of the dielectric layer. The spray exits the nozzle in the form of a cone, and the density of the spray is a function of the diameter of this cone as well as the curvature of the object at the point of application. With the nozzle close to the surface, the cone area is small and the spray is concentrated. When the nozzle is further from the surface, the concentration of the spray decreases. Thus, the present invention includes precise control of the distance of the spray head from the surface being sprayed, so as to regulate the thickness of the dielectric. The invention therefore includes programmably controlling the distance between the spray head and the surface being sprayed, that distance being varied to maintain the desired thickness of dielectric.

Heater element 36 is incorporated into the apparatus for the purpose of initially heating the ogive nose cone to an elevated temperature, and also for the purpose of accelerating the drying of the dielectric material as it is sprayed onto the ogive nose cone. This combination of initial heating of the ogive nose cone, and continued heating during dielectric application, causes initial dielectric drying on contact, and prevents running of the sprayed dielectric due to gravity or centrifugal force. To be easily sprayed, it is necessary for the dielectric material to have a low viscosity, which makes it likely to run or drip. But once the material has reached the nose cone, it is desired that the material dry as quickly as possible. The use of the heater promotes such drying, and also allows for thicker layers of dielectric to be applied per spray cycle.

FIG. 3 provides a block diagram illustrating the computer control of the spraying apparatus. Computer 41 is programmed to control the movement of motor/encoder module 42, which rotates the shaft holding the nose cone, and motor/encoder module 43, for controlling the spray head. Motor/encoder 43 may represent more than one motor/encoder, as there may be separate stages and motor/encoders provided to move the spray head linearly, and to rotate the spray head around its mounting post. The computer control of the spray head position, in coordination with the rotational speed of the ogive nose cone rotational motor, can produce a uniform dielectric coating.

Figure 4:
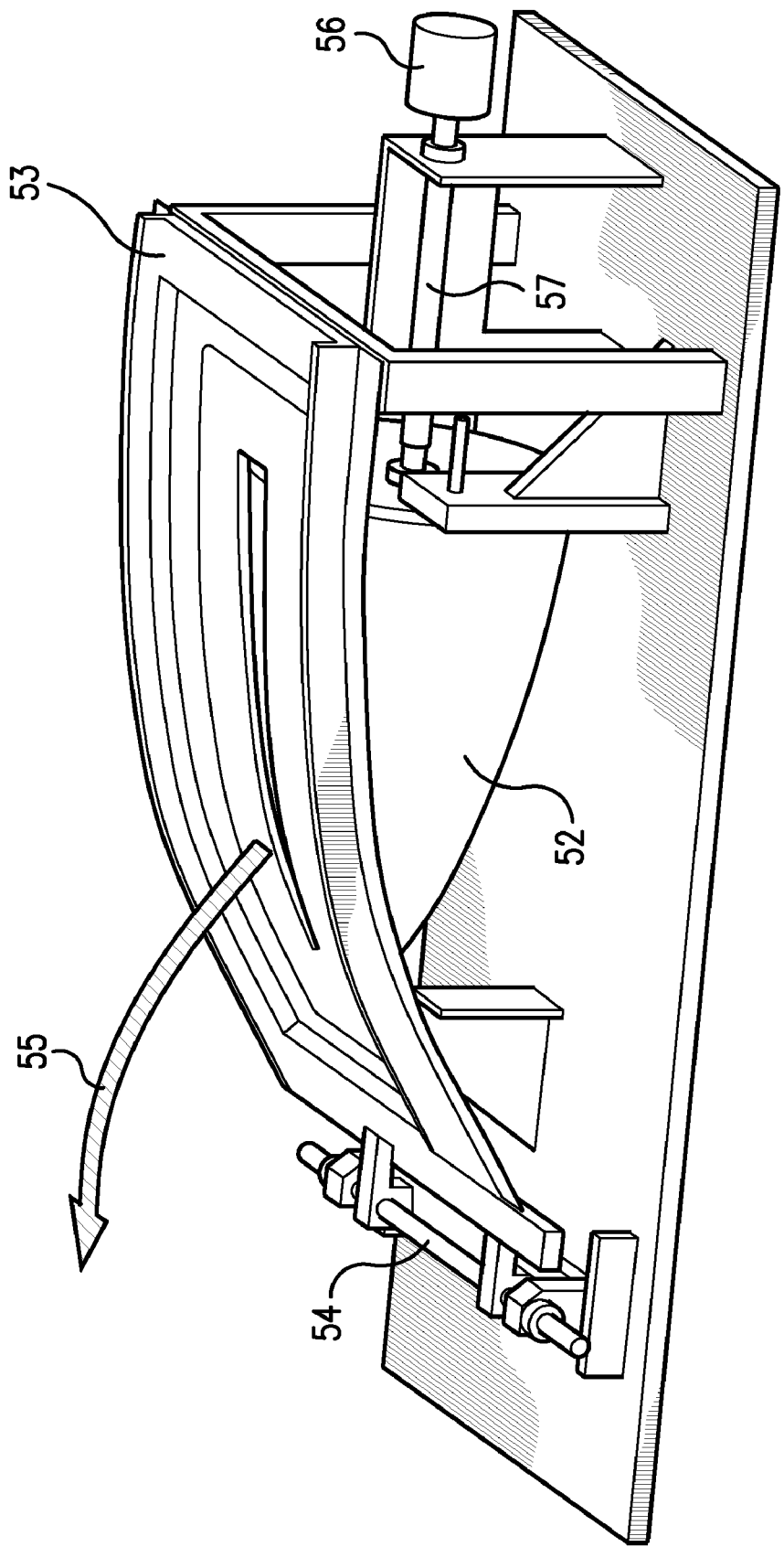
FIG. 4 provides a perspective view of an apparatus, made according to the present invention, for applying a screen or stencil segment to a section of a curved surface.
Figure 5:
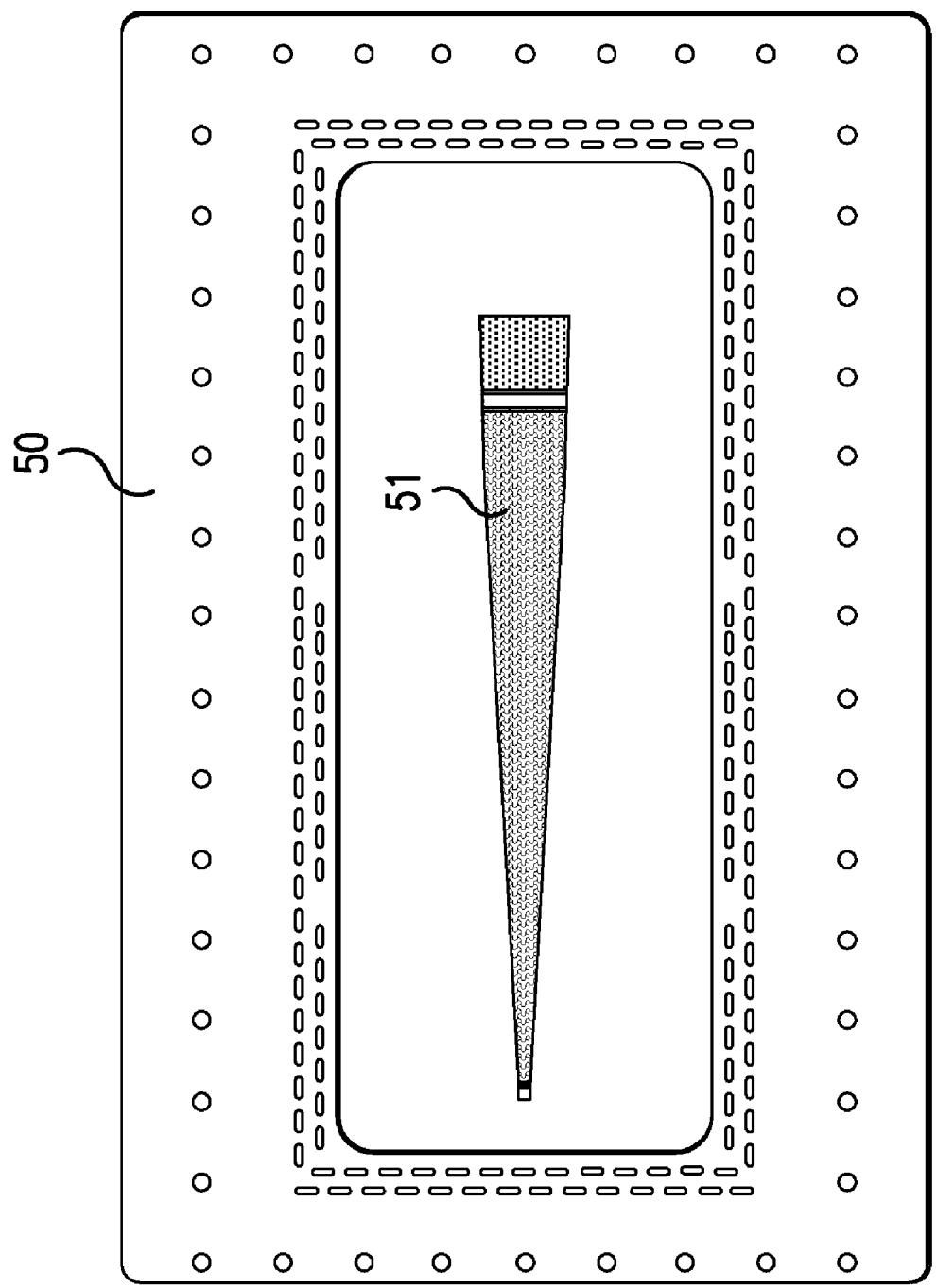
FIG. 5 provides a plan view of a screen or stencil segment used in the apparatus of FIG. 4.

As explained above, after the initial layer, or layers, of dielectric are deposited on the object, and fired and cured, the desired circuit is then applied. FIGS. 4 and 5 illustrate the apparatus for performing this step.

In brief, the circuit is screened or stenciled onto the curved surface in sections. If the curved surface is divided into a sufficiently large number of sections, each section can be considered relatively flat, and the screen or stencil can be deflected by the squeegee used to apply the conductive cermet, to the extent necessary to transfer accurately the conductive cermet pattern to the ogive nose cone. The essence of this step is therefore the screening or stenciling of the circuit, onto the curved surface, in relatively small sections, using one or more screen or stencil segments corresponding to the size of the sections.

FIG. 4 shows the application of one such screen or stencil segment to the nose cone, and FIG. 5 provides a more detailed top view of the screen or stencil segment.

The screen or stencil is charged with the conductive cermet and positioned a small distance above the substrate. A squeegee, or its equivalent (not shown), is pulled over the top of the screen or stencil. The screen or stencil then deflects, contacting the curved section of the substrate, and transfers the cermet from the screen or stencil onto the substrate. The shape of the individual sections are selected to insure that the screen or stencil can deflect to the extent necessary to achieve this momentary contact with the substrate, as necessary, to transfer the conductive cermet material from the screen or stencil to the curved substrate, to achieve the desired pattern.

As shown in FIGS. 4 and 5, a generally rectangular fixture 53 holds frame 50 which holds screen or stencil segment 51. The frame 50 and screen or stencil segment 51 are most clearly shown in FIG. 5. Because of the curvature of the nose cone, the fixture also has a corresponding curvature, so that a screen or stencil segment can be brought into close conformity with the surface to be screened or stenciled. The screen or stencil segment comprises a piece of patterned fine wire screen or, in the case of a stencil, perforated metal. The screen pattern or stencil perforations define the intended locations and shape of circuit elements. The screen or stencil segment is similar to metal screens or stencils used in the prior art for screening or stenciling a circuit onto a surface, except that the screen or stencil segment is not flat, and will generally not cover, without indexing, all of the intended circuit area of the object. The screen or stencil segment and frame are adjustable for alignment, and removable from the fixture 53.

FIG. 4 illustrates the use of fixture 53, holding frame 50 and screen or stencil segment 51, in conjunction with nose cone 52. The fixture 53 is pivotably mounted to shaft 54, mounted on a base, such that the fixture may be pivoted away from the nose cone, as indicated by arrow 55, or pivoted towards the nose cone, in the direction opposite arrow 55. Motor/encoder 56 is connected to shaft 57, which positions and drives the nose cone 52 radially. The motor is used to index the nose cone, as explained below.

In the example given, the fixture is pivoted towards the nose cone, so that the screen or stencil 51 lies immediately above and in close proximity to the surface of the ogive nose cone. A conductive cermet material, which is in the form of a paste, is applied to the screen or stencil with a doctor blade, or its equivalent, so that the cermet is deposited at the locations corresponding to the openings in the screen, or the holes in the stencil. As the doctor blade or squeegee is drawn over the screen or stencil, along its long dimension, the screen or stencil deflects and comes into contact with, and takes the shape of, the ogive nose cone section outlined by the screen or stencil. The conductive cermet material is then transferred from the screen or stencil onto the ogive nose cone section and, after the doctor blade or squeegee passes, the screen or stencil snaps back to its initial off-contact position just above the surface of the ogive nose cone. Once a section is completed, the fixture can then be pivoted away from the nose cone, as indicated by arrow 55. The nose cone is then rotated, or indexed, by the motor/encoder, such that a different section of the nose cone surface is presented at a position reachable by the screen or stencil. The fixture can then be recharged with conductive cermet and pivoted again towards the ogive nose cone, and the cermet can be screened or stenciled onto the new surface section.

It has been found particularly advantageous, in the example of the ogive nose cone, to apply the circuit segments in an interleaved pattern. That is, the surface of the nose cone is preferably divided into an even number of sections. In the particular example given, that number is sixteen sections. The circuit pattern is then laid down onto every other section.

Figure 7:
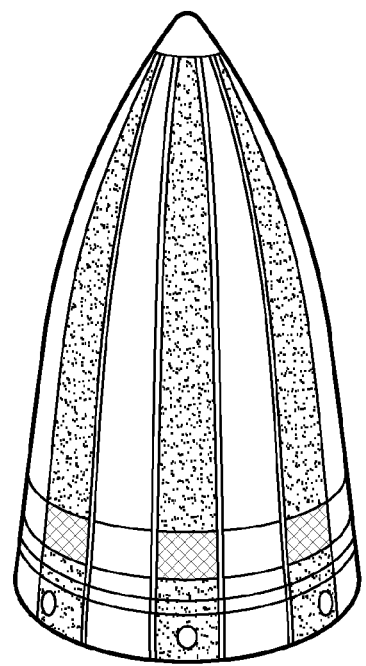
FIG. 7 provides a perspective view of an ogive radome or nose cone, wherein a circuit has been applied to some sections of the surface of the ogive radome, according to the present invention.

When the circuit has been fired, the intermediate result is as shown in FIG. 7, wherein the circuit has been applied to every other section. The process is then repeated for the sections not previously covered. The advantage of this procedure is that one can make the screen or stencil pattern laid down on the second "pass" either slightly wider or slightly narrower than what was previously applied, so as to achieve a perfect match, and to cover the entire surface precisely.

In all cases, the ogive nose cone can be easily indexed, either manually or by the motor/encoder 56, so that any desired section of the nose cone can be presented to the apparatus which lays down the circuit. Regardless of whether or not the sections are interleaved, the nose cone is fired after the circuit elements have been laid down, and before a final coating of dielectric is applied. Such firing causes the metal particles in the cermet paste to fuse together to define rugged conductors.

In the example shown, screen or stencil 51 has the shape of a rectangular structure which has been tapered. This shape is dictated by the shape of the surface of the ogive nose cone. It is clear that the surface of the ogive nose cone can be covered by a plurality of screens having the shape shown in FIG. 5, because that surface can be considered to comprise a plurality of tapered sections. But the exact shape of the screen or stencil segment can vary considerably. The shape of the screen or stencil segment depends on the shape of the object onto which it is desired to apply the circuit, and the shape of the sections comprising the surface of the object. What is important is that a curved surface be divided into a plurality of regions, and that those regions correspond to one or more screen or stencil segments used for applying the circuit.

Figure 6:
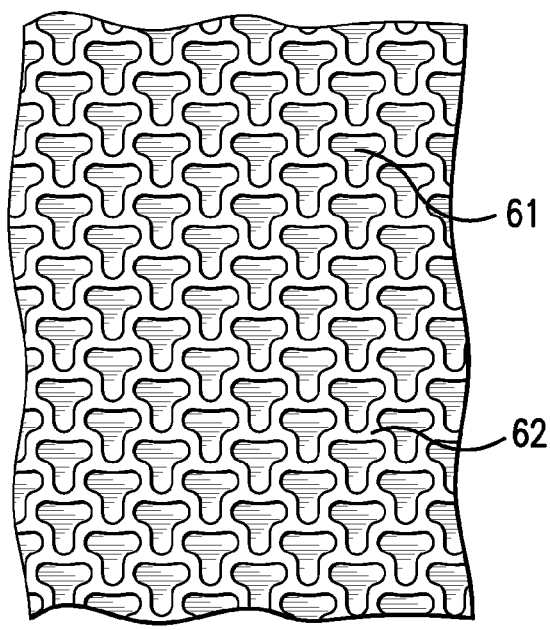
FIG. 6 provides a diagram illustrating a portion of a circuit which is to be applied to a curved surface, using the apparatus and method of the present invention.

FIG. 6 illustrates a fragment of a typical circuit which can be applied by the present invention. Areas 62 comprise the regions where the conductive cermet has been laid down, and areas 61 comprise the regions where no cermet has been applied. FIG. 6 comprises only one example of a circuit pattern.

If the solid areas in FIG. 6 represent the conductive cermet material as applied to the curved surface, either a screen or a stencil may be used. If, on the other hand, the solid areas are the open areas and the surrounding areas are to be conductive cermet, only a screen can be used. This is because the screen is a fine wire mesh with an embedded pattern that blocks the cermet from being transferred to the substrate in the unwanted areas, whereas the stencil consists of completely open holes or shapes where the conductive cermet is transferred and solid material where it is to be prevented from transferring to the substrate. Since, in FIG. 6, these solid areas would be islands, there would be no structure to support these areas unless bridging spokes were permitted to hold the stencil together. These bridging spokes would then need to be part of the clear areas of the pattern.

Figure 8:
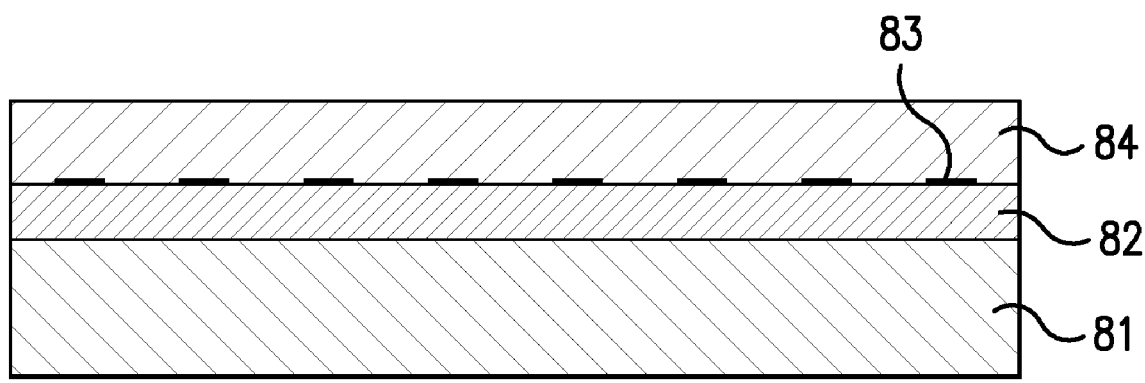
FIG. 8 provides a cross-sectional view of the circuit applied to the curved surface, according to the present invention, the figure showing the circuit layer sandwiched between layers of dielectric material.

FIG. 8 provides a cross-sectional view of the structure of the present invention. Reference numeral 81 designates the surface of the object, such as the nose cone, onto which the circuit is to be applied. Dielectric layer 82 is applied to surface 81. Layer 82 may, in fact, comprise a plurality of layers of dielectric. Circuit elements 83 are applied to the dielectric layer. The circuit is then covered by dielectric layer 84, which also may itself comprise a plurality of layers of dielectric.

For purposes of illustration, the dimensions implied by FIG. 8 are exaggerated, and are not necessarily drawn to scale.

In one example, the thickness of the initial layer of dielectric may be about 0.002 inches. The thickness of the fired cermet is typically about 0.0005 inches. The cermet material tends to sink into the dielectric, because it contains metal and is heavier than the dielectric. The cermet therefore does not contribute appreciably to the overall thickness of the structure. When the final layer or layers of dielectric have been applied, the total thickness of the coating may reach or exceed about 0.010 inches. The numbers given here are by way of example only, and are not intended to limit the invention. In practice, the thickness of the dielectric layers and the number and placement of both the conductive cermet and dielectric layers are dictated by the circuit design and by the required electrical and environmental performance.

In the examples discussed above, it was implied that the same screen or stencil segment is used multiple times on the same object. In the more general case, it is possible to form different circuit patterns on different sections of the nose cone or other object. Forming different circuit patterns at different locations can be done by providing an entirely separate fixture, with its own frame and screen or stencil assembly, of the type similar to that shown in FIG. 5. Or the different patterns could be produced by replacing the frame and screen or stencil on a single fixture by a different frame and screen or stencil assembly, defining a different circuit pattern. Indeed, one could have numerous fixtures and/or frames, providing different and distinct screen or stencil patterns, and the ogive nose cone, or other object, could be moved from one fixture to another.

The following is a summary of a typical procedure for applying a circuit to a curved surface, according to the present invention.

First, the ogive nose cone, or other object to which the circuit is to be applied, is inspected for surface defects. If the surface contains various open pores or cavities, the surface can be made smooth by skiving a dielectric paste material onto the surface, such that the paste fills the pores. The object is then fired to seal and stabilize the dielectric. If the surface is already very smooth, the above steps can be omitted.

Next, the nose cone is sprayed with dielectric, dried, and fired to form a smooth dielectric ceramic skin having a typical thickness of about 0.002 inches. This step could be performed in several iterations. That is, one could apply two or more layers of dielectric in the above manner. The ogive nose cone could be fired after each application of dielectric.

When the desired thickness of dielectric has been built up, the conductive cermet is applied. As described above, for the case where the object is an ogive nose cone, the cermet is preferably screened or stenciled onto every other section of the surface of the nose cone. The nose cone is again fired, so that the metal particles in the cermet fuse together to form conductive elements. As a result of firing, the cermet generally sinks into the dielectric layer so that the resultant layer is fairly smooth. The thickness of the fired cermet may typically be only about 0.0005 inches.

The above process of screening or stenciling the cermet onto the nose cone is then repeated for the sections of the nose cone which did not previously receive cermet.

After all desired cermet has been applied and fired, the circuit is enclosed by spraying one or more layers of dielectric onto the object. Again, the application of this final, outer coating of dielectric can be applied in one or more layers. If multiple layers are used, the object may be fired after the application of each layer, or after a group of layers have been applied.

If multiple circuit layers, separated by dielectric layers, are desired, these circuit layers are applied in the same manner as described previously for the single initial layer. For interconnection between circuit layers, screening or stenciling of the dielectric layer(s) in the same manner, and the same fixturing scheme as described above for application of the conductive cermet, can also be accomplished. To connect the circuit layers electrically, vias are created that are void of dielectric, and these are subsequently filled with the conductive cermet by screening or stenciling or skiving, as part of this invention.

The required final thickness of the outer dielectric layer depends on the level of protection needed for the circuit layer(s), based on the nature of the environment into which the object is expected to travel. The desired thickness also depends on the electrical characteristics of the electronic circuitry which may be located inside, or made part of, the ogive nose cone, and which may be used for sending and/or receiving electromagnetic signals. The circuit pattern defined by the cermet may, in one example, be designed to shield the internal circuitry from interference from the outside, while permitting such circuitry to operate as intended.

The invention can be modified in ways which will be apparent to those skilled in the art. The invention is not limited to use with particular objects, but can be used whenever it is necessary to provide one or more embedded ceramic circuit on a curved surface. Such modifications should be considered within the spirit and scope of the following claims.

What is claimed is:

1. A method of applying an electronic circuit to an object having a curved surface, comprising:
   a) applying at least one layer of ceramic dielectric material to a curved surface of an object, and firing said ceramic dielectric material,
   b) screening or stenciling a pattern of electrically conductive cermet material onto said layer of dielectric material, and firing said cermet material, and
   c) applying at least one covering layer of ceramic dielectric material onto said conductive material, and firing said covering layer of ceramic dielectric material, wherein the firing steps produce a circuit capable of withstanding extreme conditions of pressure and temperature without degradation,
   wherein step (b) is performed by applying said pattern to a first section of said curved surface, said first section occupying less than an entirety of said curved surface, moving the object, and applying said pattern to a second section of said curved surface.

2. The method of claim 1, wherein step (b) comprises the steps of:
   d) bringing a screen or stencil segment to a vicinity of the object,
   e) applying said conductive cermet material onto the object, through the screen or stencil, and
   f) moving the screen or stencil segment away from the object.

3. The method of claim 2, wherein the object is moved into a plurality of positions, and wherein steps (d)-(f) are performed for each of said positions.

4. The method of claim 3, wherein conductive cermet material is applied to a plurality of non-adjacent sections of the surface of the object, and wherein conductive cermet material is later applied to sections of the surface onto which conductive cermet material was not originally applied.

5. The method of claim 1, wherein steps (a) and (c) comprise spraying the dielectric material onto the object with a spray head while controlling a position of the spray head such that the spray head is held perpendicular to, and at a programmably controlled and variable distance from, the surface of the object while the dielectric is being sprayed.

6. The method of claim 5, further comprising controlling a position of the spray head with three degrees of freedom.

7. The method of claim 6, further comprising rotating the object so as to enable the spray head to spray substantially all of the surface of the object.

* * * * *